United States Patent [19]

Flicstein et al.

[11] Patent Number: 5,254,293

[45] Date of Patent: Oct. 19, 1993

[54] METHOD FOR OBTAINING AN ORGANIC POLYCRYSTALLINE MATERIAL

[75] Inventors: Jean Flicstein, Paris; Denise Morin, Nogent sur Marne, both of France

[73] Assignee: l'Etat Francais, represente par le Ministere des Postes, des Telecommunications et de l'Espace (Centre National d'Etudes des Telecommunications), France

[21] Appl. No.: 964,078

[22] Filed: Oct. 20, 1992

Related U.S. Application Data

[62] Division of Ser. No. 320,569, Mar. 8, 1989, Pat. No. 5,177,205.

[30] Foreign Application Priority Data

Mar. 14, 1988 [FR] France ............... 88 03285

[51] Int. Cl.⁵ .................. B29D 11/00; B29C 43/02
[52] U.S. Cl. .......................... 264/1.3; 264/6; 264/13; 264/109; 264/126
[58] Field of Search .............. 264/1.1, 1.3, 1.5, 126, 264/109, 13, 6

[56] References Cited

U.S. PATENT DOCUMENTS

| | | | |
|---|---|---|---|
| 4,044,082 | 8/1977 | Rosette | 264/1 |
| 4,758,064 | 7/1988 | Neefe | 264/1.5 |
| 4,888,401 | 12/1989 | Kawaki et al. | 264/1.1 |
| 4,978,376 | 12/1990 | Takahashi et al. | 264/1.5 |

OTHER PUBLICATIONS

J. Badan et al., Nonlinear Optical Properties of Organic and Polymeric Materials: Nonlinear Organic Crystals: Theoretical Concepts, Materials, and Optical Properties, ACS Symposium Series 233, pp. 81–107.

K. D. Singer et al., Nonlinear Optical Properties of Organic Molecules and Crystals: Electro-Optic Organic Materials, Chapter II-8, vol. 1, pp. 437–468.

Tsunekaw, Organic Nonlinear Optical Compound, vol. 12, No. 156, May 13, 1988, JP Appln. No. 61-114487.

C. Cassidy et al., Optics Communications: Nonlinear Optical Properties of Urea, May, 1979, vol. 29, No. 2, pp. 243–246.

R. V. Kochikyan et al., Soviet Journal of Quantum Electronics: Determination of the Frequency Interval of Phase-Matched Nonlinear Conversion in Powders of Various Molecular Crystals, Feb., 1986, No. 2, Woodbury, New York, USA, pp. 272–274.

Primary Examiner—Mary Lynn Theisen
Attorney, Agent, or Firm—Pearne, Gordon, McCoy & Granger

[57] ABSTRACT

Method for obtaining an organic polycrystalline material having in particular electro-optical properties, said material obtained and an electro-optical modulator comprising said material. This method includes a stage (1) for preparing a powder having a size grading of 500 to 800 nm of an organic compound having a delocalized system of $\pi$ electrons and presenting a non-centrosymmetrical crystalline structure, as well as intramolecular load transfer groupings, a stage (2) for drying the powder under vacuum, a stage (3) for pre-pressing the powder under vacuum, and a hot stage (5) for the uniaxial compression of the dried powder under vacuum. This method enables polycrystalline materials to be obtained, said materials comprising elongated monocrystalline grains orientated according to a given direction.

10 Claims, 6 Drawing Sheets

METHOD FOR OBTAINING AN ORGANIC POLYCRYSTALLINE MATERIAL

This is a division of application Ser. No. 07/320,569, filed Mar. 8, 1989, now U.S. Pat. No. 5,117,205.

FIELD OF THE INVENTION

The present invention concerns a method for obtaining a solid polycrystalline material with orientated monocrystalline grains. More particularly, it can be applied in the field of non-linear optics for the conversion of optical frequencies (obtaining an optical radiation from two radiations of different frequencies) for the electro-optical modulation of a luminous radiation (phase modulation or light polarization). In particular, the materials obtained can be used as static phase shifters in interferometers, as polarizers in display devices, as switches in pulsed lasers, or as integrated optical light guides.

BACKGROUND OF THE INVENTION

Generally speaking, the method according to the invention allows for the polycrystalline growth of any organic compound comprising molecules having a dipole moment according to an axis of symmetry generally known as a polar axis.

In known electro-optical modulators, monocrystals of mineral materials are generally used, said materials being, for example, potassium diphosphate (KDP), lithium niobate, and lanthanum, lead and zirconium titanate (PLZT).

These mineral materials present the drawback of lacking effectiveness, which requires that they must be used with large thicknesses. Furthermore, the electro-optical effect of these materials owing to their ferroelectricity results in a variation of the crystalline mesh involving high stresses inside the crystals, which generally provokes a separation of the electrodes required for modulation, as well as a premature wear of the material.

In addition, these minerals have a tendency for their refraction index to change in the course of time owing to photorefraction leading to a possible voltage drift of the electro-optical devices comprising these materials.

The manufacture of these monocrystals from mineral materials also requires high temperatures and thus a high energy consumption and significant production stresses.

Also, for a number of years now, research has been centered on the production of monocrystals from organic molecules. These monocrystals have the advantage of offering improved effectiveness as compared with mineral monocrystals, of being able to be produced at relatively low temperatures, and of presenting a wide pass-range of the transparence windows situated in the visible and near-infrared range.

The electro-optical properties of organic monocrystals are due to electronic displacements and not to variations of the crystalline mesh as in the case with mineral crystals, which provides them with improved mechanical behaviour and increases their lifetime.

For more specific details concerning the electro-optical properties of certain organic materials, reference should be made to the article by K. D. SINGER and others which appeared in the publication entitled "Non-Linear Optical Properties of Organic Molecules and Crystals", vol. 1 (1978), pp 437-467, D. Chemla and J. Zyss, Eds., AT&T Labs.

Unfortunately, it is currently extremely difficult to produce large organic material monocrystals able to be used industrially. The methods currently known for manufacturing organic material monocrystals (growth according to the Bridgmann technique or from a vapor) are difficult to implement and in particular can hardly be reproduced.

The difficulty of obtaining large organic crystals is more particularly described in the article by SINGER mentioned above.

The difficulty of obtaining large crystals from an organic material is not a specific property of materials having electro-optical properties. In fact, it is difficult to produce any large monocrystal from an organic material.

Finally, there currently does not exist any reliable commercial electro-optical device as regards organic materials.

SUMMARY OF THE INVENTION

The aim of the present invention is to provide a method to obtain a polycrystalline material comprising elongated monocrystalline grains orientated along a given direction, this material being formed of a molecular organic compound whose molecules have at least one axis of symmetry along this direction and at least one dipole orientated along this axis, this method including the following stages:

a)—preparation of a fine powder of said compound having a size grading less than one micrometer, b)—drying the powder under vacuum, c)—compression along said direction under vacuum of the dried powder.

This obtaining method is relatively simple and does not include any critical stage. Moreover, it allows for the embodiment of large organic pellets or small bars.

The inventors have found that an orientated polycrystalline material of a molecular organic compound having non-linear optical properties could replace the mineral materials currently used for electro-optical modulation and that the electro-optical responses of these materials were comparable to those of the best responses of inorganic materials. In fact, if the polycrystalline material is monophase, there will be no diffusion of light, but merely losses or attentuations of the latter derived from the refraction or reflection of the light by the pores of the material owing to the monocrystalline grain pore refraction index, reflection and refraction of light due to the anisotrophy of the grains and possibly optical absorption in the wavelength range used.

To this effect, the grain joints must be as unobstructive as possible to allow for transmission of light. Also, it is possible to advantageously use grains whose smallest dimension is of the same order of magnitude as the wavelength of the light to be modulated, indeed at least equal to this wavelength.

If the same material is to be used to modulate various wavelengths, the smallest dimension must be close to the maximum wavelength to be transmitted. For example as regards hexamethylene-tetramine (HMT), 800 nm is the maximum wavelength transmitted; also, the smallest dimension of the monocrystalline grains must be close to 800 nm so as to provide transparance on a smaller wavelength, for example 450 nm for HMT.

With the method according to the invention, it is possible to obtain organic polycrystalline small bars having a luminous transmission coefficient of 89.8% in the visible spectrum.

So as to improve orientation of monocrystalline grains, the method according to the invention advantageously includes a stage for heating under vacuum the dried powder.

The heating and drying temperatures of the powder depend on the organic compound and in particular on its steam pressure.

The heating stage can be carried out at the same time as the uniaxial under vacuum compression stage or even before this compression stage. In this latter case, sublimation of the powder is obtained and then the depositing of small crystals on the piston being used to compress the powder, the small crystals then being used as germs for the growth of the larger monocrystalline grains at the time of the uniaxial compression stage.

The small loss or attenuation of the luminous intensity traversing the polycrystalline material is directly linked to the size and shape of the elementary grains of the powder. The latter play a determining role in obtaining a material having a densification close to the theoretical value represented by the monocrystal of the same composition. Also, the powder must have a space density as low as possible and the elementary grains must have a sub-micronic size ranging, for example, from 500 to 800 nm.

The use of conglomerated particles, namely slightly dispersed, affect the sinterability of the material and result in a distribution of non-uniform porosity. Also, drying of the powder must be efficient, as the humidity of the powder retains a state of aggregation or physical condition adversely affecting sinterability. It is desirable to have a residual water content of less than 10 ppm.

Moreover, the powder needs to be extremely pure when needing to work under vacuum so as to avoid any pollution by the ambient atmosphere.

The initial idea of the invention is to reduce a compound into a powder by grinding it mechanically. Unfortunately, this method does not currently make it possible to obtain a powder having a size grading of less than one micrometer. Furthermore, as grinding is effected in the open air in a humid environment, the powder obtained is too polluted.

Also according to the invention, the powder is obtained either by atomization or by freeze drying. This latter method is more particularly adapted to a low steam pressure organic compound. Atomization and freeze drying consist of dissolving the organic compound in a slightly or averagely polar solvent at a concentration ranging from 2 to 40% by weight of the compound and, for example, from 10 to 30% by weight.

The solvent used may be an aqueous or non-aqueous solvent, such as alcohols (methanol, ethanol, pentanol, amylic alcohol, glycerol), chloroform, acetone, carbon tetrachloride or any other averagely polar organic solvent, provided the latter has a high steam pressure at the used temperatures and pressures with a view to its subsequent elimination. Moreover, as the freeze drying stage includes a freezing up stage, the solvent used for freeze drying must be able to frozen easily. Also, the solvent has, for example, a freezing temperature which is relatively low and especially not less than the temperature of liquid nitrogen.

So as to obtain good dispersion of the powder obtained, it is possible to advantageously use a eutentic mixture of the solvent and the organic compound. This eutentic mixture is then sprayed with the aid of a nozzle whose diameter of the drops obtained ranges from 0.5 to 2 micrometers. The use of a smaller nozzle may result in too great a loss of the compound, the spray or fog obtained having a tendency to fly everywhere and especially outside the vessel used to recover the powder. Moreover, a nozzle with a larger diameter does not make it possible to obtain a powder with a size grading of less than one micrometer.

A further factor involved in an extremely fine powder by means of atomization is the flowrate of spraying of the organic solution. Also, the flowrate of the compressed gas used for spraying the solution is advantageously between 500 and 600 l/h.

In the case of atomization, spraying of the solution is carried out hot, namely at a temperature allowing for evaporation of the solvent. This temperature depends therefore on the solvent, but also on the organic compound. The use of an organic solvent has the advantage of lowering the temperature to which the compounds are exposed. On the other hand, when the atomization stage is carried out hot, it is necessary to use an inert gas (nitrogen, rare gas) so as to avoid lighting of the organic solvent.

In the case of water used as a solvent, spraying is effected at a temperature ranging from 70° to 150° C. With ethanol used as a solvent, heating of the solution to be sprayed may range from 50° to 70° C.

In particular, the method according to the invention makes it possible to obtain polycrystalline materials having non-linear light propagation properties. This optical non-linearity is due to a system of delocalized electrons as well as the presence of a non-centrosymmetrical crystalline structure.

The organic molecular compounds have an electro-optical response of about one picosecond instead of about one microsecond for mineral compounds used in non-linear optics. This is in particular due to the mechanism based on displacement of the electron cloud. Thus, the organic materials according to the invention may be used in ultra-rapid electro-optical circuits. Moreover, no voltage drift of the electro-optical devices including the monocrystals of organic materials has been observed.

Furthermore, the organic compounds have wide molecular susceptibilities. Advantageously, delocalization of the $\pi$ electrons is intensified by the adding of load transfer or polar groupings. In addition, the presence of a dipole along at least one axis of symmetry of the molecule or preferably along a symmetry plane of the molecule favors the growth of large elongated monocrystalline grains orientated along a given direction, this direction being that of the polar axis of the molecules.

The system of delocalized $\pi$ electrons is in particular due to the presence according to the invention of at least one heteroatom in the carbon-containing chain of the organic material. These heteroatoms form part of a cycle, possibly aromatic, or are directly linked to the carbon of an aromatic cycle. As is the case with heteroatoms, it is possible to cite nitrogen, oxygen, sulfur or phosphorus. As regards the heteroatom cycle, one could cite other cycles, namely pyridine, furan, pyrrole, thiopene, oxazole, pyrazine, thiazole, pyrimidine, purine, pyridazine, piperidine, pyran cycles, etc.

Preferably, the compounds able to be used in the invention comprise at least one atom of nitrogen or at least one atom of oxygen or both. To this effect, it can be noted that the compounds comprising one nitrogen atom and one oxygen atom in a para position of a benzole cycle make it possible to obtain high conjugation and a large load transfer conferring on these compounds extremely high optical non-linearity.

In order to be used in non-linear optics, the materials according to the invention must present high chemical stability during interaction with light. To this effect, substituted heteroatoms, that is not linked to hydrogens, ensure sound chemical stability. In particular, it is preferable to avoid using compounds comprising too many N-H linkages.

The use of a compound whose crystalline structure is non-centrosymmetrical makes it possible to obtain second order non-linearity. This structure is generally due to the presence of an asymmetrical carbon.

The organic compounds of the invention must in addition be resistant to optical damage so as to avoid any irreversible change of the refraction index.

The following compounds can be used in the invention: urea; hexamethylene-tetramine (HMT); derivatives of pyridine-N-oxide such as 3-methyl-4 -nitropyridine-1-oxide (POM) and 3.5 dimethyl-4-nitropyridine-1-oxide metanitroaniline (mNA); the derivatives of 4-nitroaniline such as 2-methyl-4 -nitroaniline (MNA), 2-chloro-4-nitroaniline, 2-bromo-4 -nitroaniline and dimethylamino-4-nitrobenzene; 4-N-dimethylaminobenzaldehyde (AMA); 2-(2.4 -dinitrophenyl)-methyl aminopropanoate (MAP), 4-N-N-dimethylamino-4'-nitrostilbene (DANS) or even 4-N(nitrophenyl)-2(hydroxymethyl)pyrrolidine (NPP).

It is preferable to use compounds deprived of the N—H linkage, compounds such as HMT, 4-nitropyridine-1-oxide and its derivatives, dimethylamino-4-nitrobenzne, AMA, DANS and NPP.

The polycrystalline material according to the invention may advantageously be used in an electro-optical modulator in order to either modulate the phase or the polarization of a luminous beam. To this effect, the polycrystalline material must be transparent to the wavelength of the beam to be modulated and the grains may be orientated according to the direction of this beam. In addition, two electrodes must be provided on the upper surface of the material, these electrodes being disposed perpendicular to the monocrystalline grains.

this electro-optical modulator may be advantageously used in a large wavelength range extending from ultraviolet to infrared. There are numerous applications of the electro-optical modulator according to the invention. In particular, this modulator can be used when:
- polarization or the phase of the light needs to be modulated,
- the power of the beam to be modulated is relatively high, this applying as regards laser beams,
- the passband required is greater than 50 MHz (video sphere),
- the frequency of the modulated beam does not have to be translated (the frequency of the incident beam is equal to the frequency of the beam transmitted by the modulator),
- the colinearity of the incident beam and the transmitted beam is required,
- the diameters of the beams to be modulated are large.

BRIEF DESCRIPTION OF THE DRAWINGS

Other characteristics and advantages of the invention shall appear more readily from reading the following description, given by way of illustration and being in no way restricrtive, with reference to the annexed figures in which.

DETAILED DESCRIPTION OF THE PREFERRED EMBODIMENTS

Figure 1:
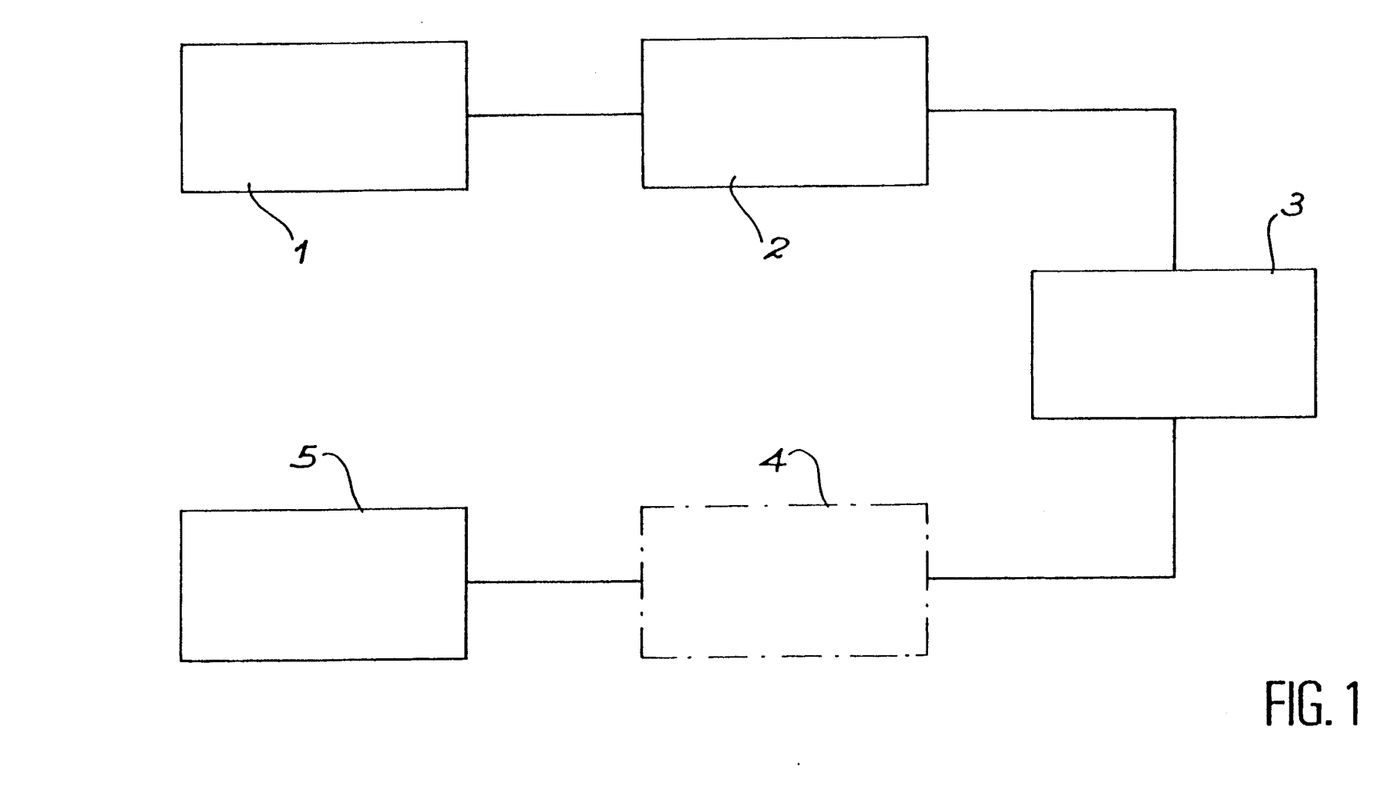
FIG. 1 is a diagram giving the various stages of the method according to the invention.

FIG. 1 shows a diagram giving the various stages of the method according to the invention.

The method of the invention includes a stage for preparing a fine powder from an organic compound and bearing the reference 1, a stage for drying this powder under vacuum and bearing the reference 2, a pre-pressing stage bearing the reference 3, a heating under vacuum stage 4 and a generally hot uniaxial under vacuum pressing stage 5.

With a view to simplification, the method according to the invention shall be described for the production of an HMT polycrystalline material and a urea material.

So as to obtain an ideal transparent electro-optical material, this material needs to be dense, have a transmission loss minimum figure and have a maximum number of grains oriented along a given direction. One of the most important points is the quality of the starting powder and it is illusory to want to obtain a sound transparent material from a powder not responding to certain criteria. Also, this of necessity involves a powder:
- with high purity and every effort must be made to retain this purity during the various operations for obtaining the polycrystalline material,
- whose grain size is the smallest possible, less than one micrometer and especially of the same order of magnitude as the wavelength of the best transmitted radiation,
- whose grain size distribution is narrow. In fact, despite certain earlier theories, it is preferable to have an extremely constrained size grading distribution (D/d=2 where D represents the maximum diameter of the grains and d represents the average diameter of these grains) so as to reduce porosity of the final material and control growth of the grains,
- with non-agglomerated particles and thus well-dispersed and dry, as the humidity retains a state of aggregation or physical condition which affects the sinterability of the final material, and with a distribution of non-uniform porosity,
- grains of the equiaxed powder. In effect, the tridimensional shape of the grains is important for simpler future stacking of grains with a simple hot pressing, with possibly a bevelled morphology of the grains.

A polycrystalline material, transparent in the visible spectrum, and according to the invention must transmit light with a minimum amount of transmission losses. Now, one of the possible causes of transmission loss is the presence of impurities in the material. Also, at least a purity of 99.5% is required for the starting product.

The annexed table gives the various properties of HMT and urea.

In this table, $r_{41}$ represents the value of the electro-optical linear coefficient (Pockels coefficient) expressed by a reduced tensorial notation. For details concerning the definition, reference should be made to the article by K. D. Singer and others.

Furthermore, HMT sublimates at 263° C. without melting with a partial decomposition. It is volatile at a lower temperature (steam pressure of 27 Pa at 100°-110° C.). Also the crystals are hygroscopic. Thus precautions need to be taken for polishing surfaces and conversion of the final material. This material presents both a longitudinal and a transverse electro-optical effect.

As regards urea, there is a melting point of 132.7° C. Moreover, it is sublimated under vacuum at temperatures below the melting point. Finally, urea is stable at ambient temperature and at atmospheric pressure, but is less hygroscopic and absorbs the humidity of the atmosphere.

1. OBTAINING A FINE POWDER OF THE ORGANIC COMPOUND

According to the invention, the fine powder is obtained by atomizing (or spraying an aqueous or alcoholic solution of the organic compound by means of a nozzle, diameter 0.5 mm, and is sprayed inside a compressed hot air current. The solvent evaporates immediately and envelops the vapor product, thus protecting it against the effects of excessive heat. The product passes from the liquid phase to a state of aggregation in the form of a fine dry powder without deteriorating. X-ray analysis has enabled this to be confirmed.

Atomization is a method for obtaining a fine dry powder whose size grading is less than one micrometer and thus proving to be satisfactory for obtaining the polycrystalline material according to the invention. The powder obtained is very slightly polluted.

The annexed table II gives the various operating conditions for atomization.

A further method for obtaining a powder according to the invention is freeze-drying which includes the dissolving of the organic product in an aqueous or alcoholic solvent; this is followed by freezing this solution and then its sublimation under vacuum with a view to eliminating its solvent.

The solvent able to be used for freeze-drying must be able to be solidified by cooling and must have in its solid condition a steam pressure sufficiently high so as to allow for its extraction by sublimation under a moderated vacuum and at a reasonable speed. Although the water does not constitute the perfect solvent for freeze-drying, it is this solvent which has been selected owing to its relatively high solidification temperature (0° C.).

Freeze-drying results in a dry powder being obtained. The solvent content of the powder is highly-reduced (less than 0.02%) and it is preferable to use it immediately for compression.

So as to avoid polluting the powder, the most pure as possible solvents are used. For water used as a solvent, it is possible to use the water supplied by a MilliΩ purification unit sold by the Millipore company and has a minimum resistivity of 18 MΩ/cm. This water contains at the most 12 ppm of mineral impurities.

So as to prevent separation of the solution, during freezing it is preferable to use an eutectic composition, thus conferring greater latitude as regards the rate of cooling. It is also possible to carry out extremely fast freezing with the desired concentration solutions and, especially if required, with highly-diluted solutions.

In order to obtain a satisfactory quality product by means of freeze-drying, it firstly is necessary to know the freezing temperature and the starting defrosting temperature of the organic solution (solvent + organic compound), this starting defrosting temperature not to be reached for correct freeze-drying without passing to the intermediate liquid state. The sublimation temperature is about from 5° to 10° C. less than the starting defrosting temperature.

The starting defrosting temperatures and the concentrations of eutectic solutions may be determined by means of differential thermal analysis at a low temperature for the various concentrations of the compound in the solution. For example, it is possible to use the Sétaram differential thermal microanalyzer suitable for low temperatures, this device being cooled by liquid nitrogen.

Figure 2:
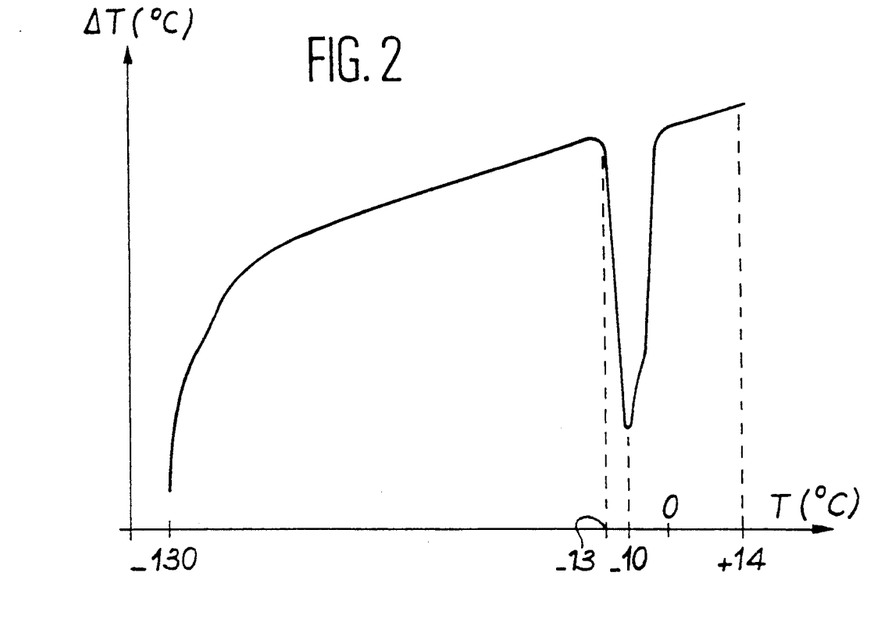
FIG. 2 shows the starting defrosting curve of an aqueous solution of HMT.

FIG. 2 gives the differential thermal analysis of a 20% weight of HMT of an aqueous solution indicating that the starting defrosting temperature is equal to −13° C. This curve gives in abscissae the temperature in °C. and in ordinates the temperature variation ΔT.

Figure 3:
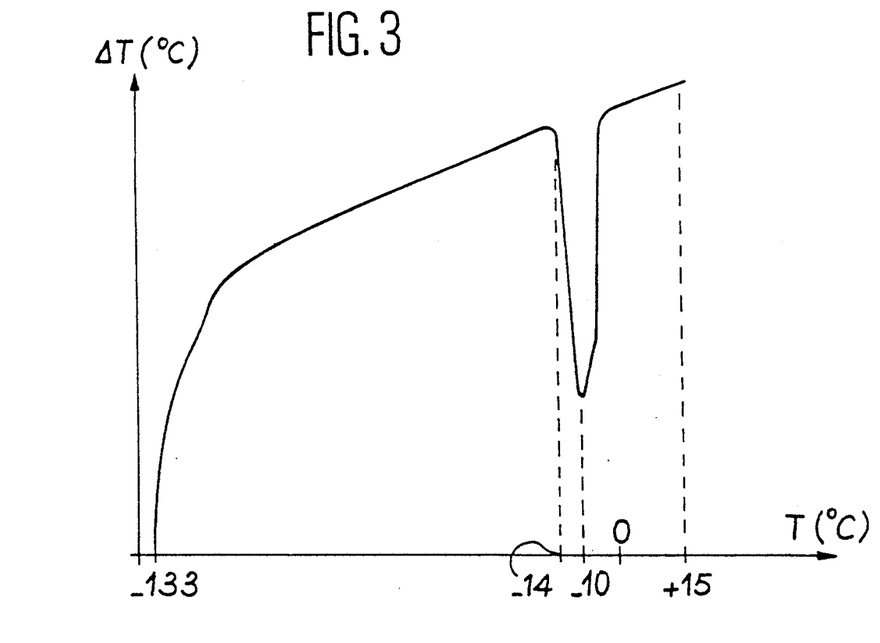
FIG. 3 shows a starting defrosting curve of an aqueous solution of urea, FIG. 4 gives an HMT freeze-drying curve, FIG. 5 gives the HMT steam pressure variations with the powder drying temperature.

In these same conditions, a differential thermal analysis is carried out on a 20% weight of urea aqueous solution. This analysis is represented on FIG. 3. The curve shows a starting defrosting temperature at −14° C. The temperature measurement is evaluated to within 1° C.

The morphology and crystalline size of the powder is solidified upon freezing and, for a large part, conditions the direction of sublimation and the qualities of the final product. A morphology in small equiaxed crystals is desirable for easy sublimation and a more homogeneous final product.

Freezing may be carried out in bulk in a Pétri box placed in the vessel of the Sérail RP 2 V type freeze dryer.

The freezing rate is that of the device and the refrigerating agent fluid is Freon R502. In these conditions, one hour is required so as to lower the ambient temperature to −45° C., a temperature which is sufficient in order to freeze an aqueous solution of HMT and an aqueous solution of urea.

It is also possible to freeze the solution by means of atomization in liquid nitrogen and then transferring the frozen product into a Pétri box placed in the freeze-dryer vessel already brought down to −45° C. In these conditions, freezing is immediate.

Atomization in liquid nitrogen is described in detail in the document FR-A-2 251 535 by M. PAULUS. The hollow cone type spraying nozzle has a diameter of 0.41 mm.

Freeze-drying is continued by sublimating the solvent of the organic compound. This sublimation is effected at a pressure of less than the steam pressure of the solvent to the selected freeze-drying temperature by taking account of the obtained results of differential thermal analysis.

At any moment, the solid state must remain and thus prevent any physical transformation with deliquescence of the powder. This physical transformation must strictly be avoided so as to preserve homogeneity of the powder.

For HMT and urea, sublimation may be carried out at a temperature ranging from −23° C. to −18° C.; the steam pressure of the water used as a solvent at −20° C. is about 100 Pa (0.8 torrs). Also, once the vacuum in the vessel reaches a pressure of more than 100 Pa, ice starts to sublime.

In practice, it is possible to limit the pressure in the vessel of the freeze-dryer to 16 pa (0.16 mbars) during sublimation. A higher vacuum does not improve the rate of evaporation and proves to be more of an obstacle in transferring calories from the bottom of the vessel towards the product.

This pressure of about 16 Pa makes it possible to keep the temperature of the product below the defrosting temperature and is nevertheless sufficiently high to allow for a correct rate of evaporation, namely one which is not too fast so as to avoid the powder becoming too light outside the freeze-dryer and one which is not too slow for a relatively short freeze-drying period.

At the end of the sublimation stage, a higher vacuum is re-established so as to facilitate extraction of the residual humidity contained in the product obtained. In particular, a pressure of 5 Pa (0.05 mbars) may be used.

Figure 4:
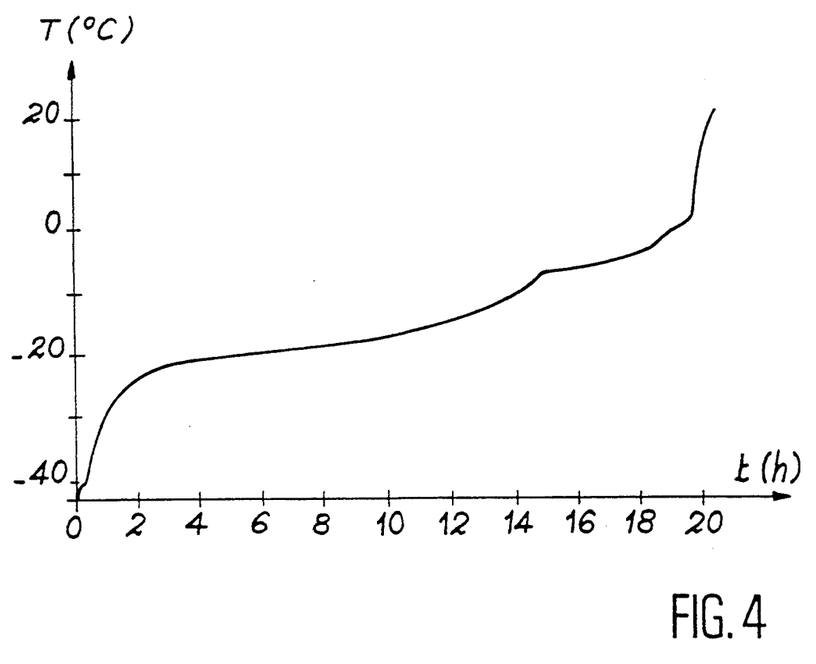

By way of example, FIG. 4 shows an HMT freeze-drying curve. The abscissae give the time t in hours and the ordinates give the temperature T in degrees C.

The final freeze-drying stage and that of atomization concerns elimination of the residual water, namely the water molecules retained by absorption inside the apparently dry powder.

Also, the method according to the invention comprises a drying stage.

2. DRYING OF THE POWDER

The temperature of drying varies for each product and depends on its steam pressure and the desired degree of desiccation. Given the fact that the organic products have high steam pressures at relatively low temperatures, it is necessary to heat the material to a temperature at least equal to 60° C.

According to the product, the maximum drying temperature may be determined by observing deterioration of the vacuum according to the temperature in the vacuum chamber in which is the mould to be used to produce the solid material. The product must be firstly manually pressed so as to avoid any product loss at the time it is placed in a vacuum. The pressure values P are then raised according to the temperature and are marked on a semi-logarithmic paper.

Figure 5:
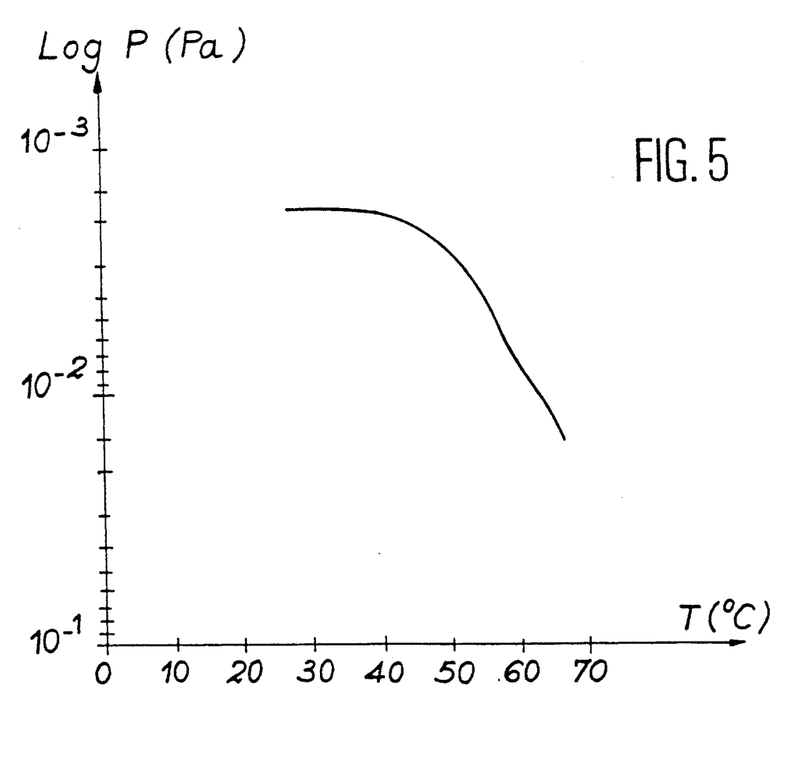

By way of example, FIG. 5 gives the variations of the steam pressure of pre-pressed HMT with the drying temperature. The pressure, expressed in Pas, is laid off as ordinate in the form of a logarithm, and the temperature, expressed in degrees C, is laid off as abscissa.

This curve shows that the maximum drying temperature is equal to 35° C.

This technique for determining the maximum drying temperature has been carried out in the same way for urea and a value of 50° C. was obtained.

The dried powder thus obtained can then be pressed in order to obtain a polycrystalline material.

3. PRESSING

Figures 6A, 6B:
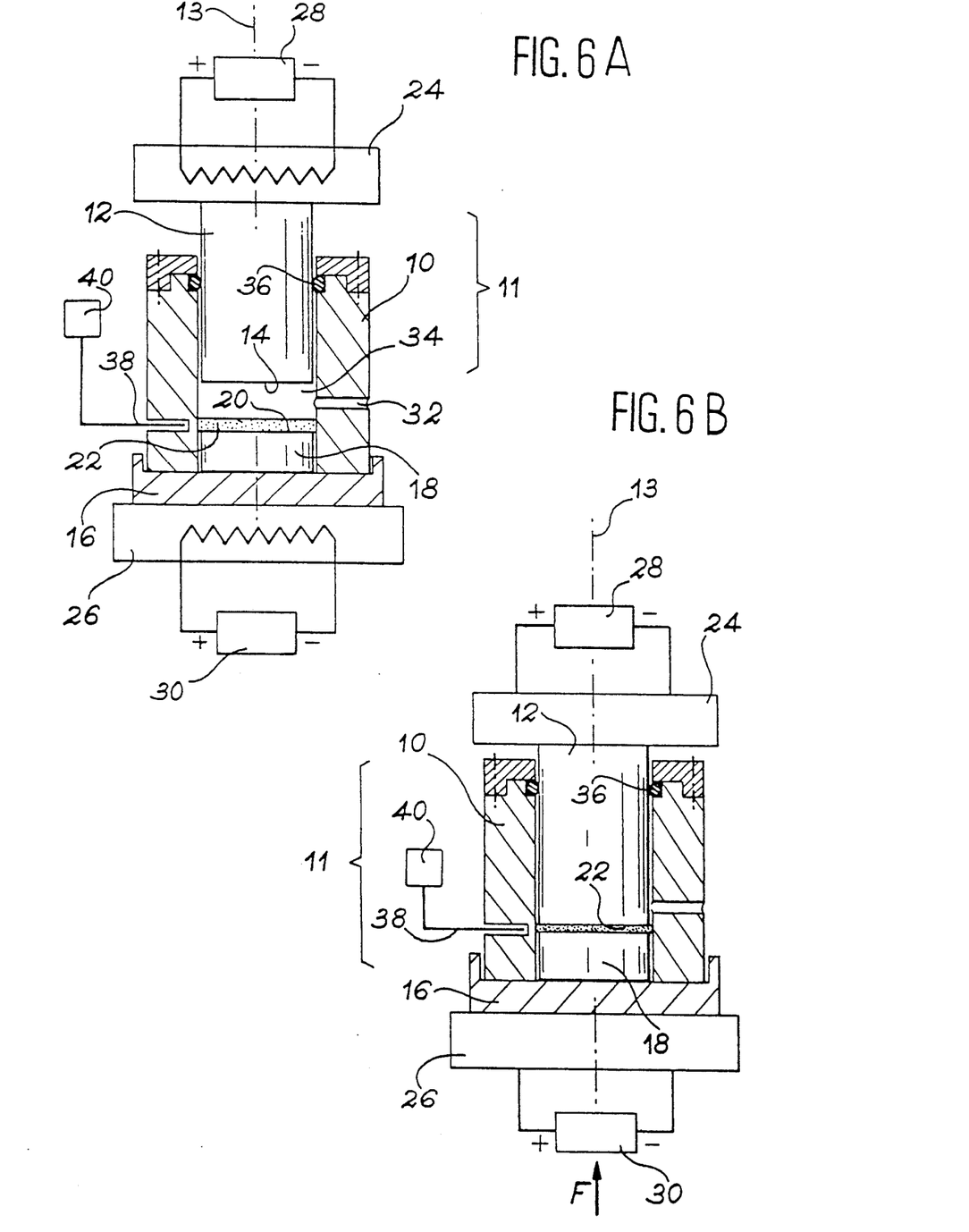
FIG. 6 shows the mould used for pressing of the powder so as to obtain a polycrystalline material according to the invention.

Pressing is effected with the mould shown diagrammatically on FIG. 6. This mould 11 is made of structural hardening martensitic steel, usually known as Maraging steel. It includes a hollow cylinder 10 in which a piston 12 moves along the axis 13 of the cylinder 10. The base 14 of the piston is polished. The base of the cylinder 10 rests on a mounting plate 16. Inside the cylinder 10 and in support on the mounting plate 16, there is a support 18 whose upper face 20 is polished and is parallel to the base 14 of the piston. The support 20 is designed to receive the previously obtained powder 22 to be compressed.

The mould 11 is placed between two heating resistor type plates, namely one fixed plate 24 and one mobile plate 26, the resistors of the fixed plate being connected to a first electric power supply source 28, and the resistors of the mobile plate being connected to a second electric power supply source 30.

The cylinder 10 is provided with several openings 32 disposed radially and making it possible to draw out the air in the compression chamber 34 and in the powder 22; the compression chamber 34 is defined by the internal walls of the cylinder 10, the face 20 of the support 18 and the base 14 of the piston 12. So as to keep the chamber 34 in a partial vacuum, an O-ring seal 36 encompassing the piston 12 is provided at the upper part of the cylinder 10.

Filling of the mould is effected with a completely dry funnel placed in the center of the mould so as to allow for even distribution of the powder.

So as to know the temperature existing in the compression chamber 34, a thermoelement 38 connected to an electronic measuring device 40 is housed opposite the support 18.

Part A of FIG. 6 represents the position of the mould at the time of being placed under vacuum prior to pressing, and part B shows the position of the mould during pressing.

This uniaxial press type device with heating plates enables maximum temperatures of 250° C. to be reached on the plates.

The heating plates 24 and 26 are made of copper, the press providing a uniaxial pressure shown on the diagram by the arrow F by means, for example, with a Basset press. Placing the compression chamber 34 under vacuum can be provided with an Alcatel primary pump having an air flowrate of 8 cubic metres per hour and an Edwards secondary diffusion pump having a pumping rate of 300l/second and a final vacuum of less than $10^{-5}$ Pa ($10^{-7}$ torrs).

Pressing first of all comprises a hot or cold prepressing stage. This prepressing must be carried out at a pressure allowing the powder to be transformed into a compact, but this pressure must not be too high so as to retain open porosity of the compact. In fact, a closed porosity prevents a supposed correct vacuuming of the powder and an evacuation of the gases occuring inside the compact. As these gases are unable to leave at the time of hot pressing (or sintering), large pores shall be left which constitute a diffusion and thus a non-transparence source of the final material, or even a cracking source if the gases happen to escape from the final product.

This processing may be carried out at a pressure ranging from $6.25 \times 10^4$ to $17.5 \times 10^5$ Pa and especially equal to $12.5 \times 10^4$ Pa. This prepressing is carried out at ambient temperature for 15 mns under secondary vacuum of about $8 \times 10^{-5}$ Pa ($6 \times 10^{-7}$ torrs).

There then follows the actual pressing stage. The uniaxial pressure applied to the material must not exceed the elastic limit of the material. Moreover, the pressing rate must be less than 25 micrometres/s and for example equal to 20.

This pressing stage is mainly effected hot. However, the HMT may be pressed cold under a pressure of $2.4 \times 10^7$ Pa with a vacuum of 0.6 Pa ($5 \times 10^{-2}$ torrs), provided the diameter of the pellet is no more than 13 mm.

The hot pressing stage may be controlled in two different ways.

The first way consists of heating the plate 26 to a temperature of more than 50° C., such as for example 60° C., the plate 24 being kept at ambient temperature. Then a temperature gradient is created between the base 14 of the piston and the support 18. The vacuum inside the compression chamber 34 is kept at 5 Pa. The piston 12 is kept in the top position, as shown on part A of FIG. 6. Under the effect of the temperature gradient, the powder sublimes and the volatilized molecules come and are secured in contact with the piston 12 at a temperature lower than the support 18. Then microcrystals of about 10 micrometres and of uniform size are formed.

The growth of the microcrystals inside the mould naturally starts at the coldest location. These microcrystals serve as germs and a continuous front is formed by the adjacent crystalline grains. Gradually, the number of crystals emerging from the front decreases, whereas the surface contributed by each crystal increases.

In this "competition" to obtain a place on the first row of the front, the crystals orientated so that the fastest direction is the normal one at the advance front shall those which shall survive. Consequently, after a covered distance which exceeds the average distance between the monocrystalline grains ($\leq 1$ $\mu$m), all the crystals developed inside the material have an elongated form seen as a vertical section and are almost parallel with respect to each other. Thus, the transformed column-shaped texture (see FIGS. 7 and 8) is obtained in one section of the final material, provided the lateral thermal gradient is nil or negligible.

In this crystalline growth, it has been seen that the thicker the final material is with respect to the average initial size of the elementary grain of the powder, the more reduced shall be the resulting number of crystals and equally their development shall be closer to normal in the compact.

When all the powder has been sublimated, the heating plate 24 is heated to a temperature of more than about 50° C. then a pressing is made at 1.7 MPa for about 15 mins with a controlled air leak of $2.5 \times 10^{-2}$ Pa resulting in the growth of the microcrystals into larger transparent and monocrystalline crystals.

An X-ray analysis via the Laüe method will have confirmed the monocrystalline nature of the crystals. In addition, a transparence or polarized light examination with a Zeiss microscope enables one to see the extinction of these crystals.

Figure 7:
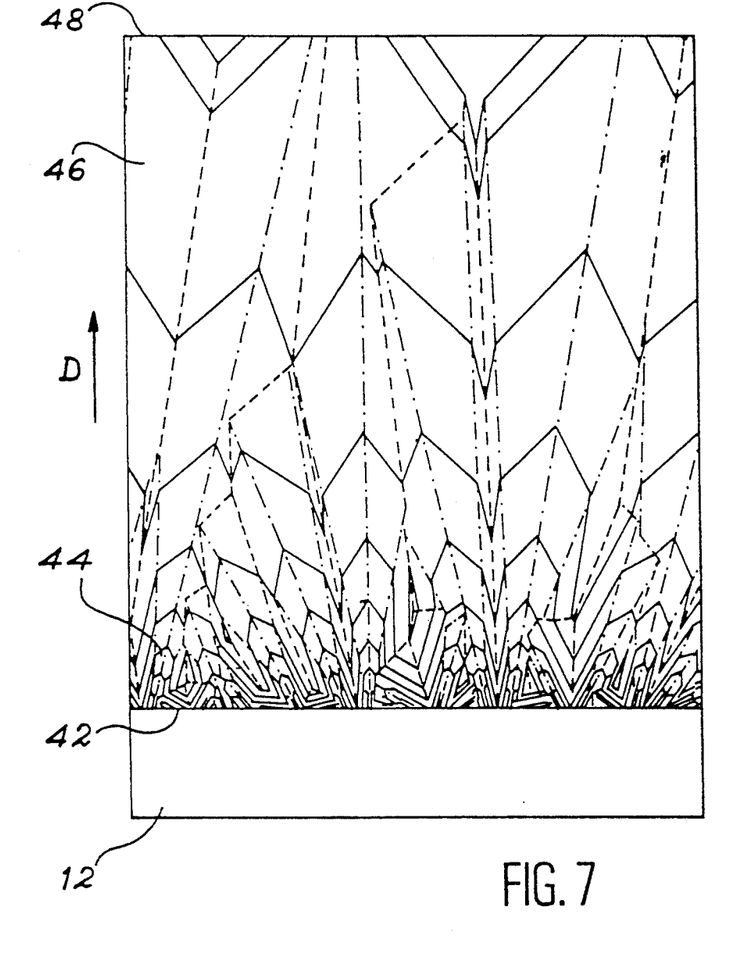
FIG. 7 is an example of a material obtained showing the monodirectional orientation of the monocrystalline grains.

FIG. 7 shows the polycrystalline material obtained. The lower face 42 of the polycrystalline material, which corresponds to the one in contact with the piston 12, comprises monocrystalline grains 44 much smaller than the grains 46 situated on the upper face 48 of the obtained polycrystalline material. It is these smallest grains which have been used as germs for the growth of the monocrystals 46.

In accordance with the invention, the monocrystalline grains 46 of the material are orientated along a given direction D perpendicular to o the surface of the piston 12. So as to eliminate the lower part of the polycrystalline material, a machining is carried out followed by an optical polishing. Similarly, the upper face of the material undergoes an optical polishing.

According to the invention, it is possible to suppress the sublimation stage and thus to directly compress the powder 22 hot under vacuum.

The compactness of the polycrystalline materials obtained shall have been measured by the geometrical method, namely a non-destructive method. The compactness of the products obtained varies from 98.3 to 99.2 and the maximum density attained is 1.318, which is relatively close to the density of a monocrystalline material. Moreover, the transparance of these materials shall have been measured by a light transmission method and by spectrophotometry.

The results are entered on the annexed table III and give the conditions for hot pressing of the HMT powder, its optical density and its transmission coefficient T% for various wavelengths in the visible spectrum.

The sample 3, which has been treated in the same way as for sample 2, except for the fact that hot pressing has been carried out 72 hours after formation of the powder, has transmission coefficients smaller than those of the sample 2. This is linked to the fact that HMT is hygroscopic and that its transparance is not preserved indefinitely. Also, so as to obtain a polycrystalline material according to the invention as HMT, the pressing stage has to be carried out after the powder has been formed.

Furthermore, in order to retain this transparance, it is desirable to protect the polycrystalline material obtained immediately after it has been produced. This can be effected by using an encapsulating agent in which the HMT is dissolved and which does not attenuate the transparence of the polycrystalline material. By way of example, the protective product could be Siceront KF1280 protective varnish, which is a petroleum ether-based varnish.

Samples 1 to 4 of table III relate to HMT polycrystalline materials whose diameter is 13 millimetres and thickness is 0.580 mm.

With the previously-described method, pellets are also embodied being 25 mm in diameter and having a thickness of 543 micrometres. The transparence and pressing conditions of the product obtained and the optical density for different wavelengths are entered on the final line of table III.

Unlike the case with HMT, cold pressing under vacuum of urea is unsuitable for obtaining the transparent polycrystalline material according to the invention. Also a hot pressing, possibly preceded by a hot pre-pressing under vacuum, is necessary.

Different conditions for the hot pressing of an urea powder shall have been carried out and the results are entered on the annexed table IV. The last line of the table gives as a comparison the transmission percentage of a PLZT pellet. It should be noted that the transmission coefficient is higher as regards the latter. This is certainly due to excessive heating during pressing and also to the smallest thickness of the PLZT pellet used.

The average optical density obtained for the sample 7 is 2.62 and may reach 2.66.

Table IV relates to urea pellets 18 mm in diameter and having undergone a prepressing at $12.5 \times 10^4$ Pa under primary vacuum ($5 \times 10^{-3}$ Pa) at a temperature of 50°-60° C.

Figure 8:
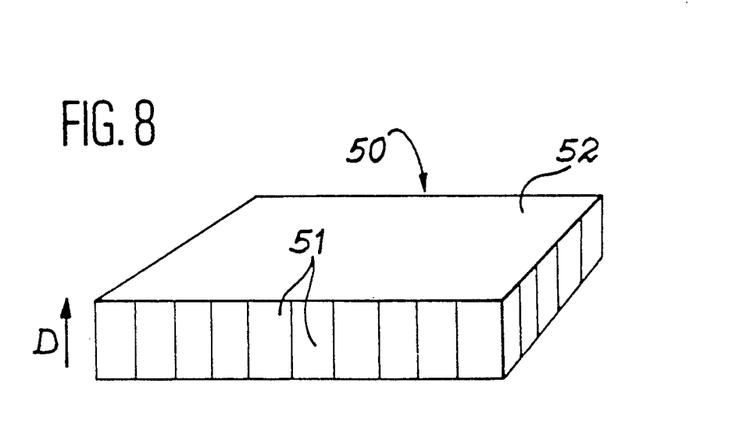
FIG. 8 shows a further example of the material obtained according to the invention.

With the method according to the invention, it has been possible to obtain an HMT polycrystalline material 50 with a transformed column-shaped structure having a thickness of 580 micrometres, as shown on FIG. 8. The monocrystalline grains 51 orientated perpendicular to the largest surface 52 of the material (along the direction D) have a length equal to the thickness of the polycrystalline material.

Figure 9:
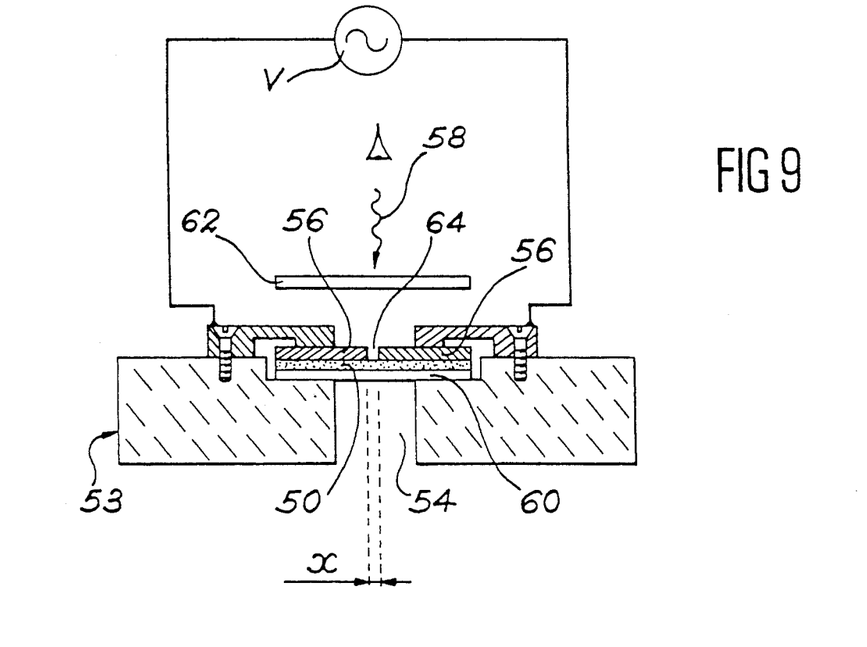
FIG. 9 is a skeleton diagram of the device used to detect the electro-optical effect in a material according to the invention.

Revealing the electro-optical effect of the polycrystalline materials according to the invention has been detected and displayed by means of the device represented on FIG. 9. The polycrystalline material 50 according to the invention and whose thickness is about 580 micrometres is placed on a glass sample-carrier 53 comprising an opening 54 opposite the material 50 to be analysed. Two electrodes 56 are glued onto the upper face of the material 50 and are separated from a distance X by 0.5 mm. These two electrodes 56 are parallel to each other and are made of copper. The sample-carriers and the material 50 are looked at under an optical microscope (Zeiss Universal), the light polarization vector shown by the arrow 58 and the electric field created between the two electrodes 56 being parallel. Voltage is applied by means of a d.c. electric power supply source 59 at one kHz during observation with the microscope.

After extinction between two crossed polarizers 60 and 62, transparence through the material 50 can be observed from a threshold voltage. The threshold voltage values found for an HMT material according to the invention vary from 900 to 1100 volts. These threshold voltages have been compared with those obtained for the PLZT samples, this material having for an equivalent thickness threshold voltages varying from 2300 to 2900 V.

These threshold voltage differences are due to the fact that the electrodes 56 were simply glued onto the polycrystalline material of the invention (where there is poor electric contact and a poor electricity conductive glue) whilst the PLZT electrodes were evaporated gold electrodes. As a result, the value of the measured threshold voltage on the HMT can be improved considerably by especially embodying an electro-optical modulator with evaporated gold electrodes.

Whichever case applies, following application of the threshold voltage, the material 50 according to the invention has become transparent in the area 64 situated between the two electrodes 56.

In these experimental conditions, there occurs an electro-optically induced refraction index variation for HMT of $6.4 \times 10^{-6}$ and $5.4 \times 10^{-6}$ for urea. These recorded refraction index changes dn introduce a phase shift p of the light traversing the polycrystalline material given by the equation: $p = (2\pi/l) \cdot dn \cdot e$, where dn represents the index difference induced electro-optically, l the wavelength of the light transmitted and e the thickness of the polycrystalline material.

In these conditions, for a wavelength of 600 nanometres, there occurs a phase shift of $4.02 \times 10^{-5}$ for HMT and $3.39 \times 10^{-5}$ for urea.

Figure 10:
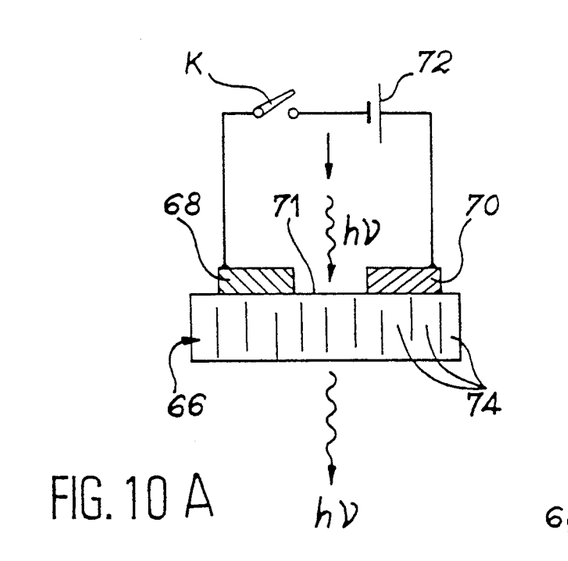
FIG. 10 shows the operating principle of a polarizer using a polycrystalline material according to the invention.

The material according to the invention may also be used as an electro-optical modulator and in particular as a polarizer whose functioning is shown on the diagram on FIG. 10.

A material according to the invention 66 is equipped with two evaporated gold electrodes 68 and 70 on one of the faces 71 of the material. These electrodes are connected to a d.c. electrical power supply source 72. A circuit switch K makes it possible to close or open the electric circuit.

When the circuit is open, part A of FIG. 10, the light (hν) arriving on the upper face 71 of the material and orientated parallel to the monocrystalline grains 74 of the material according to the invention is transmitted and stands out by the lower face of the material. When the electric circuit is closed, part B of FIG. 10, the incident luminous beam (hν) arriving parallel to the monocrystalline grains 74 of the material is thus absorbed by the non-transmitted material.

By way of example, three examples are shown below for obtaining a urea and HMT transparent pellet having a diameter of 13 mm and a thickness of 580 micrometres.

EXAMPLE 1

An aqueous solution with 20% weight of HMT is prepared from water originating from a Millipore and HMT unit (Milliq model) commercialized by Merck with a minimum purity of 99.5%. The solution obtained is bulk-frozen thoroughly flat inside a Pétri box in a freeze-dryer commercialized by Sérail at −44° C. for 4 hours. The pressure is then lowered to 20 Pa (0.2 mb) and the temperature is brought down to −20° C. so as to embody freeze-drying.

After desiccation under a vacuum of 50 Pa (0.5 mb) for about one day, the powder is taken out of the freeze-dryer, the final temperature being 20° C. and the pressure being 50 Pa. The freshly obtained powder is then crushed in a mortar and is then introduced into the pressing mould 11 (FIG. 6) whose internal diameter is 13 mm and thus equal to the diameter of the future pellet.

This powder is kept in a low vacuum ($6 \times 10^{-3}$ Pa) for 3 to 4 hours in the pressing mould at ambient temperature (20° C.). An uniaxial pressure of $2.4 \times 10^7$ Pa (according to the reading of the pressure gauge) is applied by means of a Perkin-Elmer press for 15 minutes.

The transparence of the pellet obtained has been verified by visual inspection and transmission measured by the VIS/IR spectrophotometry technique. The highest value obtained after attenuation correction by multiple reflections on the HMT-air interface is 95%.

A check is made of the bi-modal distribution of the monocrystalline grains. Grains with a sub-micronic diameter have been determined by a technique using Rayleigh diffusion of the light and those grains of supra-micronic dimension have been determined by X-ray diffusion. The monocrystalline grains had a dimension ranging from 800 to 5000 nm.

EXAMPLE 2

An aqueous HMT solution is prepared according to the same conditions as in example 1. This solution is then atomized with a Büchi laboratory atomizer (with a nozzle with a 0.5 mm diameter). The input temperature of the atomization gas is kept at 116° C. and the outlet temperature at 74° C. with a compressed air flowrate of 500 to 600 litres per hour. The freshly obtained powder is then crushed in a mortar and introduced into the same pressing mould as in example 1. This powder is kept under a low vacuum for 3 to 4 hours at ambient temperature. A uniaxial pressure of $2.4 \times 10^7$ Pa is then applied for 15 minutes. Transparence has been verified as in example 1.

The yield obtained in 40%.

EXAMPLE 3

An aqueous solution of 4% Aristar BDH urea with a purity of 99.9% is prepared from water derived from the above-mentioned Millipore unit. The solution obtained is frozen by atomization in liquid nitrogen through an Emani nozzle with a nitrogen pressure of $6 \times 10^5$ Pa (6 bars). The frozen solution is gathered into a Pétri box placed inside the vessel of a Sérial freeze-dryer cooled to $-46°$ C. Freezing is carried out for 3 to 4 hours.

Then a low vacuum of $2 \times 10^{-3}$ Pa is carried out for 25 minutes. Freeze-drying is continued under a reduced vacuum of 16 to 17 Pa until attaining ambient temperature of 20° C. Then drying under vacuum is carried out at 4.5 pa for one day without heating and then with progressive heating until about 30° C. is reached.

The freshly obtained powder is then crushed in a mortar and is then introduced into a pressing mould as described previously. After desiccation at 47° C. under a low vacuum with a controlled leak of $2.5 \times 10^{-2}$ Pa for 3 hours (time required to increase the temperature), a prepressing of 0.1 tons under a low vacuum is carried out for 10 minutes at a temperature of 20° C. followed by a uniaxial pressing of $2.4 \times 10^7$ Pa for 15 minutes at 50° C. and under a pressure of $17 \times 10^5$ Pa. Transparence has been verified by visual inspection and transmission measured by the VIS/IR spectrophotometry technique.

The highest value obtained for transmission, after attentuation correction by multiple reflections of the air-urea interface, was 51%.

TABLE I

| | HMT | UREA |
|---|---|---|
| Space group of crystals | 143 m | 42 m |
| mesh | cubic | quadratic |

TABLE I-continued

| | HMT | UREA |
|---|---|---|
| | body-centered | $a = 0.5645$ nm |
| | $a = 0.7021$ nm 0 | $c = 0.4704$ nm 0 |
| density at 20° C. | 1.33 | 1.323 |
| transparence | 300–2200 nm | 210–1400 nm |
| refraction index | 1.5936 at 25° C. for $\lambda = 633$ nm | 1.484 at 20° C. |
| $r_{41}$(experimental) | $0.72 \times 10^{-12}$ mV$^{-1}$ | $1.86 \times 10^{-12}$ mV$^{-1}$ |

TABLE II

Operating conditions for atomization

| Sample | Input T° (°C.) | Output T° (°C.) | Compressed air | Atomization time flow-rate | Atomization yield (%) |
|---|---|---|---|---|---|
| Alcoholic HMT solution (10%) | 116 | 74 | 500–600 | | |
| Alcoholic HMT solution (2% ethanol) | 70 | 56 | 500 | 16 mns | 21 |
| Alcoholic HMT solution (2% ethanol) | 62–64 | 54–50 | 500 | 50 mns | 28 |
| Aqueous urea solution (10%) | 148 | 100 | 600 | 8 m 30 s | 30 to 40* |

(*the 40% yield takes account of the powder collected in the cyclone dust catcher).

TABLE III

| HMT SAMPLE | PERKIN-ELMER VACUUM PRESS PRESSING CONDITIONS | HMT PRESSING TRANSMISSION ACCORDING TO WAVELENGTH | | | | | |
|---|---|---|---|---|---|---|---|
| | | 400 nm D. opt T % | 480 nm D. opt T % | 560 nm D. opt T % | 650 nm D. opt T % | 750 nm D. opt T % | 800 nm D. opt T % |
| 1 (13 mm) | heating plate dried powder: drying: low vacuum 6.5 pressing: 15 mins + vacuum: 6.5 | 0.39/ 40.73 | 0.31/ 49.1 | 0.27/ 53.76 | 0.235/ 58.14 | 0.205/ 62.34 | 0.185/ 65.36 |
| 2 (13 mm) | outgoing freshly powder drying: low vacuum 6.5 5 h pressing: 12.5 MPa 15 mins + vacuum: 8 | | 0.255/ 55.86 | | 0.25/ 56.18 | | 0.24/ 57.8 |
| 3 (13 mm) | same pellet as 2 (72 hrs after pressing) | | 0.355/ 44.25 | | 0.36/ 43.67 | | 0.36/ 43.67 |
| 4 (13 mm) | outgoing freshly powder drying: low vacuum 6.5 4h pressing: 12.5 MPa 15 min + vacuum: 6.5 | 0.2725/ 53.39 | 0.217/ 60.64 | 0.175/ 66.8 | 0.1425/ 72.04 | 0.1125/ 77.22 | 0.1/ 79.43 |
| 5 (25 mm) | outgoing freshly powder drying: low vacuum $2 \times 10^{-3}$ 5h pressing 15 MPa + vacuum 6.5 | | 0.43/ 37.17 | 0.36/ 43.67 | 0.30/ 50.25 | 0.25/ 56.18 | 0.23/ 58.82 |

TABLE IV

| UREA sample | Treatments undergone | | | thickness (in mm) | % transmission | | |
|---|---|---|---|---|---|---|---|
| | T.° (°C.) | Pressure | vacuum (Pa) | | Ave | Max | Min |
| 6 | 60 | 5 T 15 mn | 4 × | 0.580 | 49 | 51 | 46 |

TABLE IV-continued

| UREA sample | T.° (°C.) | Pressure | vacuum (Pa) | thickness (in mm) | % transmission Ave | Max | Min |
|---|---|---|---|---|---|---|---|
| 7 | 60 | 5 T 1 h | $10^{-3}$ $8.6 \times 10^{-3}$ | 0.580 | 49 | 51 | 47 |
| 8 | 90 | 5 T 15 mn | $8.9 \times 10^{-3}$ | 0.580 | 47 | 49 | 44 |
| 9 | 60 | 5 T ¾ h | $7.9 \times 10^{-2}$ | 0.290 | 35 | 45 | 32 |
| C | | | | 0.205 | 72 | 72 | 72 |

What is claimed is:

1. Method for obtaining a polycrystalline material comprising elongated monocrystalline grains orientated along a given direction, this material being formed from a molecular organic compound whose molecules have at least one axis of symmetry along this direction and at least one dipole orientated along this axis, this method comprising the following stages:
   a)—preparation of a fine powder of said compound having a size grading less than one micrometre,
   b)—drying under vacuum of the powder,
   c)—compression of the powder under vacuum along this direction.

2. Obtaining method according to claim 1, wherein it includes a stage for heating under vacuum the dry powder.

3. Obtaining method according to claim 2, wherein the heating stage and compressing stage are carried out at the same time.

4. Obtaining method according to claim 1, wherein stage c) is preceded by an under vacuum prepressure stage.

5. Obtaining method according to claim 1, wherein the powder is formed by atomization or freeze-drying.

6. Obtaining method according to claim 5, wherein stage a) consists of dissolving the organic compound in a polar solvent so as to form a solution and spraying this solution in order to obtain drops 0.5 to 2 micrometres in diameter.

7. Obtaining method according to claim 6, wherein the solvent is an organic solvent.

8. Obtaining method according to claim 6, wherein freeze-drying includes a stage for freezing the sprayed solution in liquid nitrogen.

9. Obtaining method according to claim 6, wherein the solution contains 2 to 40% weight of the compound.

10. Obtaining method according to claim 1, wherein the powder has a size grading of 500 to 800 nm.

* * * * *